(12) United States Patent
Jeung et al.

(10) Patent No.: US 8,607,638 B2
(45) Date of Patent: Dec. 17, 2013

(54) MICRO ELECTRO MECHANICAL SYSTEMS COMPONENT

(75) Inventors: Won Kyu Jeung, Seoul (KR); Jong Woon Kim, Seoul (KR); Heung Woo Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 183 days.

(21) Appl. No.: 13/324,918

(22) Filed: Dec. 13, 2011

(65) Prior Publication Data

US 2013/0068022 A1    Mar. 21, 2013

(30) Foreign Application Priority Data

Sep. 15, 2011    (KR) ........................ 10-2011-0092898

(51) Int. Cl.
*G01L 9/16* (2006.01)
*H01L 29/84* (2006.01)

(52) U.S. Cl.
USPC ............................................ 73/754; 257/415

(58) Field of Classification Search
None
See application file for complete search history.

(56) References Cited

U.S. PATENT DOCUMENTS

2005/0263878 A1    12/2005    Potter
2013/0167640 A1*    7/2013    Lim et al. ................... 73/514.01

FOREIGN PATENT DOCUMENTS

JP    06-242139 A    9/1994
KR    10-2009-0067080 A    6/2009

OTHER PUBLICATIONS

Office Action dated Oct. 29, 2012 for corresponding Korean Application No. 10-2011-0092898 and its English summary.

* cited by examiner

*Primary Examiner* — Andre Allen
(74) *Attorney, Agent, or Firm* — Ladas & Parry, LLP

(57) ABSTRACT

Disclosed herein is a MEMS component. The MEMS component according to the exemplary embodiment of the present invention includes: a plate-shaped membrane 110; a post 130 disposed under an edge 115 of the membrane 110; a stopper 140 disposed under the membrane 110 and disposed more inwardly than the post 130 so as to form a space 143 between the stopper 140 and the post 130; and a cap 150 disposed under the post 130 so as to cover the post 130, whereby the influence of disturbance or noise occurring from external environments or interference from surrounding sensors can be interrupted by using a predetermined region 145 of the membrane 110 disposed above the space 143.

14 Claims, 9 Drawing Sheets

MICRO ELECTRO MECHANICAL SYSTEMS COMPONENT

CROSS REFERENCE TO RELATED APPLICATION

This application claims the benefit of Korean Patent Application No. 10-2011-0092898, filed on Sep. 15, 2011, entitled "Micro Electro Mechanical Systems Component", which is hereby incorporated by reference in its entirety into this application.

BACKGROUND OF THE INVENTION

1. Technical Field

The present invention relates to an MEMS component.

2. Description of the Related Art

Micro electro mechanical systems (MEMS) are a technology of manufacturing an ultra-fine machine structure, such as a ultra-high density integrated circuit, an inertial sensor, a pressure sensor, an oscillator, or the like, by machining silicon, crystal, glass, or the like. The MEMS component has a precision of micrometer ($1/1,000,000$ meter) or less and structurally uses a semiconductor micro manufacturing technology that repeats processes, such as deposition, etching, or the like, thereby mass-producing micro products at low costs.

An inertial sensor, one of the MEMS components, has been used in various fields, for example, the military, such as an artificial satellite, a missile, an unmanned aircraft, or the like, vehicles, such as an air bag, electronic stability control (ESC), a black box for a vehicle, or the like, hand shaking prevention of a camcorder, motion sensing of a mobile phone or a game machine, navigation, or the like.

The inertial sensor generally adopts a configuration in which a mass body is bonded to a flexible substrate such as a membrane, or the like, so as to measure acceleration and angular velocity. Through the configuration, the inertial sensor may calculate the acceleration by measuring inertial force applied to the mass body and may calculate the angular velocity by measuring Coriolis force applied to the mass body.

In detail, a process of measuring the acceleration and the angular velocity by using the inertial sensor will be described in detail below. First, the acceleration may be obtained by Newton's law of motion "$F=ma$", where "$F$" represents inertial force applied to the mass body, "$m$" represents a mass of the mass body, and "$a$" is acceleration to be measured. Therefore, the acceleration may be obtained by sensing the inertial force F applied to the mass body and dividing the measured inertial force F by the mass m of the mass body that is a predetermined value. Meanwhile, the angular velocity may be obtained by Coriolis force "$F=2m\Omega \cdot v$", where "$F$" represents the Coriolis force applied to the mass body, "$m$" represents the mass of the mass body, "$\Omega$" represents the angular velocity to be measured, and "$v$" represents the motion velocity of the mass body. Among others, since the motion velocity v of the mass body and the mass m of the mass body are values that are known in advance, the angular velocity $\Omega$ may be obtained by sensing the Coriolis force (F) applied to the mass body.

However, the inertial sensor according to the prior art is influenced by disturbance or noise occurring from external environment or interference from surrounding sensors and as a result, sensitivity thereof may be degraded.

In addition, in the inertial sensor according to the prior art, when an excessive force is applied to the mass body, supporting parts of the mass body, for example, the membrane, or the like, may be damaged. In particular, when the inertial sensor crashes to the ground due to free falling, a very large force is applied to the mass body, such that it is highly likely to damage the supporting part of the mass body.

In addition, in the inertial sensor according to the prior art, so as to protect the mass body, a cap needs to be bonded to a bottom surface of a post so as to surround the mass body and an adhesive bonding the post to the cap may be permeated into the post. When the adhesive is permeated into the post, a space between the mass body and the cap is reduced, thereby deteriorating dynamic characteristics of the inertial sensor. In addition, when an amount of the adhesive permeating into the post is increased, the adhesive is directly bonded to the mass body, thereby causing defects of the inertial sensor.

Although the above-mentioned problems are described based on the inertial sensor, the above-mentioned problems may also occur in the pressure sensor, the oscillator, or the like, having a very similar structure to the inertial sensor among the MEMS components.

SUMMARY OF THE INVENTION

The present invention has been made in an effort to provide an MEMS component capable of preventing an influence of disturbance occurring from external environments or noise or interference from surrounding sensors, by forming a space between a post and a stopper to use a predetermined region of a membrane disposed above the space.

According to a preferred embodiment of the present invention, there is provided a MEMS component, including: a plate-shaped membrane; a post disposed under an edge of the membrane; a stopper disposed under the membrane and disposed more inwardly than the post so as to form a space between the stopper and the post; and a cap disposed under the post so as to cover the post.

A top surface of the cap and a bottom surface of the post may be bonded to each other by an adhesive and the bottom surface may be provided with at least one cavity into which an adhesive is introduced.

The top surface of the cap and the bottom surface of the post may be bonded to each other by the adhesive having a predetermined thickness and an interval between the top surface of the cap and the bottom surface of the stopper may be spaced apart from each other by the predetermined thickness.

The bottom surface of the stopper may contact the top surface of the cap when the membrane is displaced downwardly.

The MEMS component may further include a mass body disposed below a central portion of the membrane.

The central portion of the cap may be provided with a concave portion depressed in a thickness direction.

The space between the post and the stopper may be formed in an annular shape when being viewed from a cross section.

The space between the post and the stopper may have an inner peripheral surface formed in a circular shape and have an outer peripheral surface formed in a squared shape when being viewed from a cross section.

The MEMS component may further include extension parts extending from the stopper to the post through the space and formed in a predetermined pattern so as to be spaced apart from each other.

A plurality of the cavities may be formed in a predetermined pattern so as to be spaced from each other along the post.

The predetermined region disposed above the space between the post and the stopper in the membrane may be provided with a through hole in a thickness direction of the membrane.

The MEMS component may be an inertial sensor.
The MEMS component may be a pressure sensor.
The MEMS component may be an oscillator.

DESCRIPTION OF THE PREFERRED EMBODIMENTS

Figure 1A:
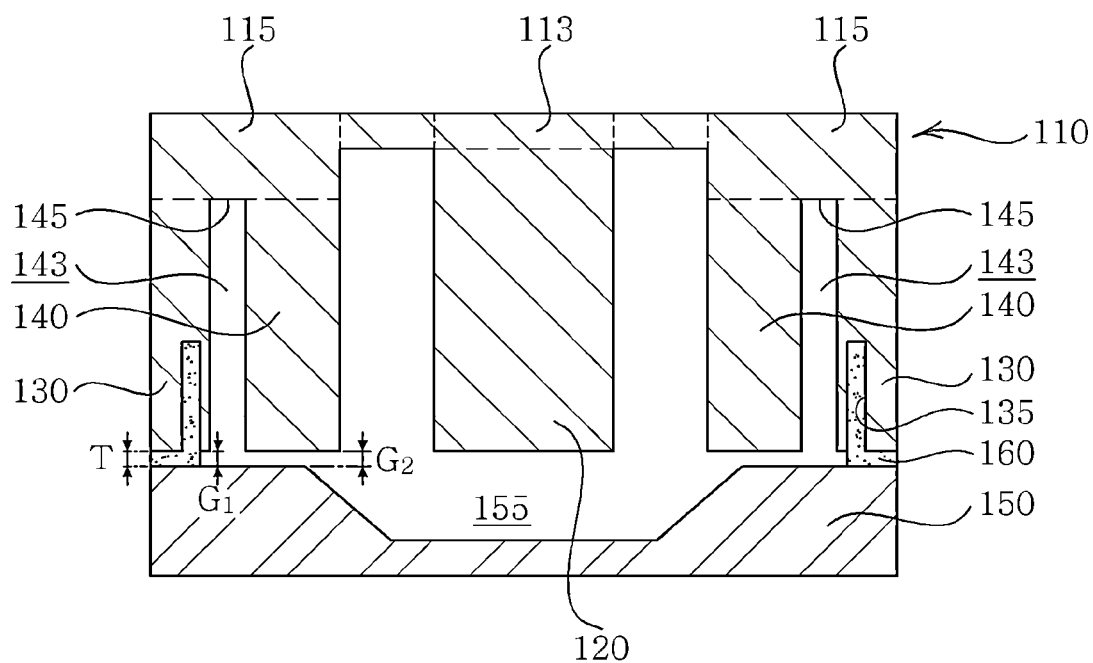
FIGS. 1A and 1B are cross-sectional views of an inertial sensor according to a preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. In describing the present invention, a detailed description of related known functions or configurations will be omitted so as not to obscure the gist of the present invention.

Hereinafter, preferred embodiments of the present invention will be described in detail with reference to the accompanying drawings.

Figure 1B:
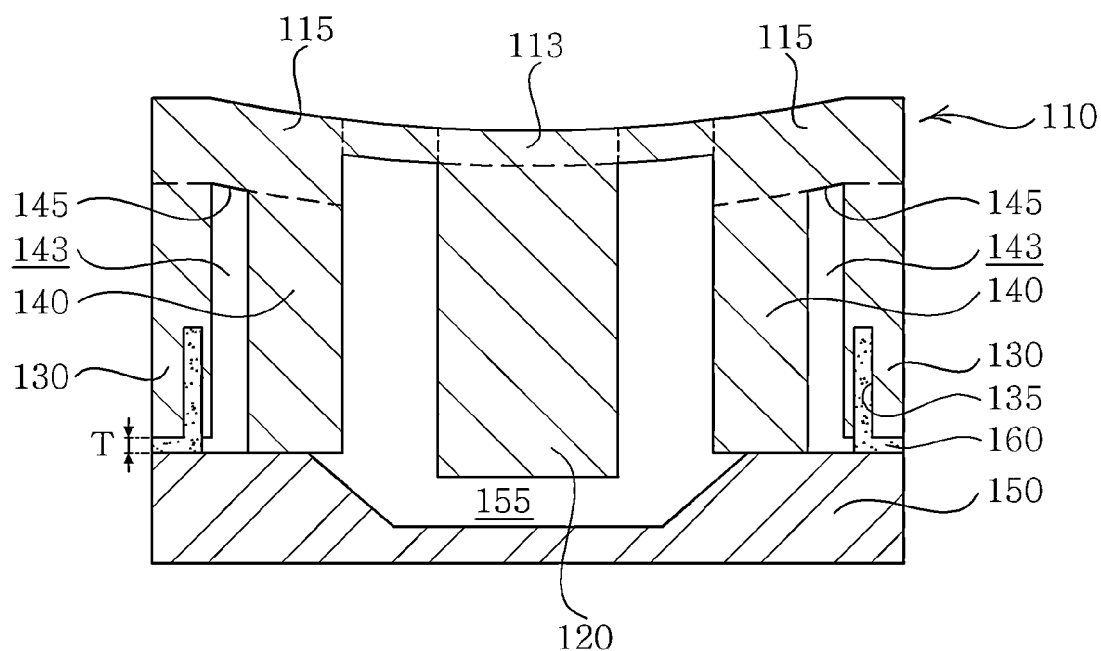
Figure 2:
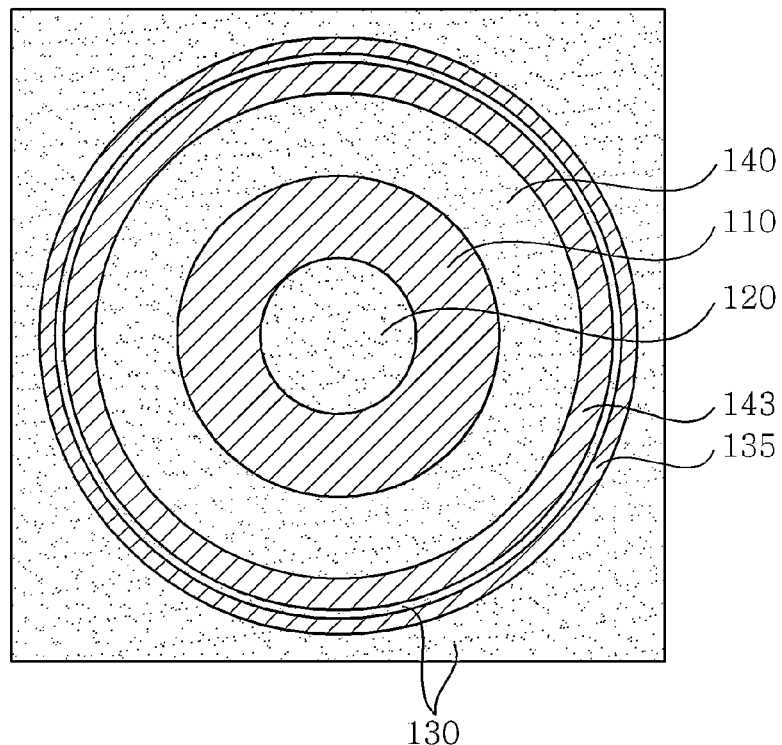
FIG. 2 is a bottom view showing a state in which a cap is removed from the inertial sensor shown in FIG. 1.
Figure 3:
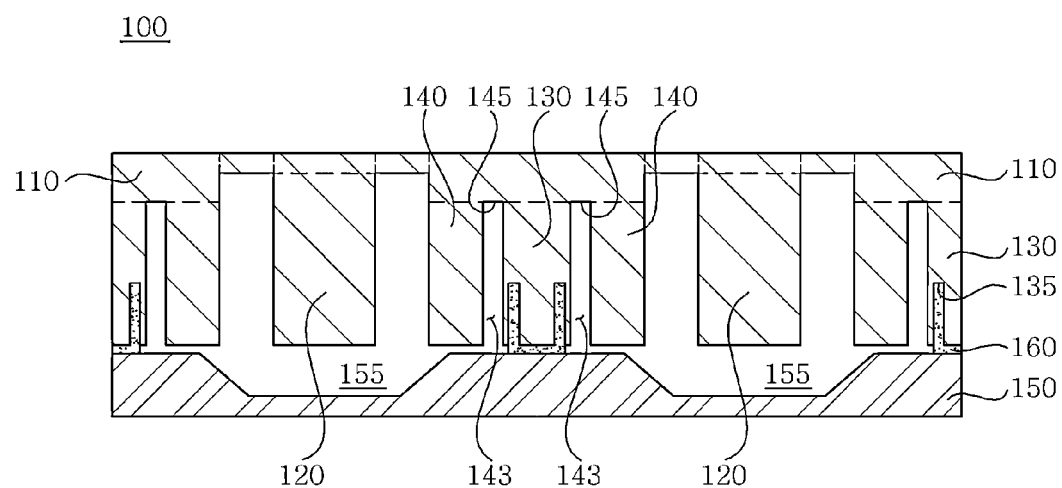
FIG. 3 is a cross-sectional view of an inertial sensor according to another preferred embodiment of the present invention.

FIGS. 1A and 1B are cross-sectional views of an inertial sensor according to a preferred embodiment of the present invention and FIG. 2 is a bottom view showing a state in which a cap is removed from the inertial sensor shown in FIG. 1. In addition, FIG. 3 is a cross-sectional view of an inertial sensor according to another preferred embodiment of the present invention and FIGS. 4A to 4D are bottom views showing a modified example of the inertial sensor shown in FIG. 2.

As shown in FIGS. 1A and 1B and 2, an inertial sensor 100 according to a preferred embodiment of the present invention is configured to include a plate-shaped membrane 110, a post 130 disposed under an edge 115 of the membrane 110, a mass body 120 disposed under a central portion 113 of the membrane 110, a stopper 140 disposed under the membrane 110 and disposed inwardly more than a post 130 so as to form a space 143 between the post 130 and the stopper 140, and a cap 150 disposed under the post 130 so as to cover the post 130.

The membrane 110 is formed to have a plate shape and thus, has elasticity that may displace the mass body 120. In this configuration, a boundary of the membrane 110 is not accurately differentiated, but may be partitioned into a central portion 113 of the membrane 110 and an edge 115 disposed along an outside of the membrane 110. In this configuration, the mass body 120 is disposed under the central portion 113 of the membrane 110, such that the central portion 113 of the membrane 110 is displaced corresponding to the motion of the mass body 120. In addition, the bottom portion of the edge 115 of the membrane 110 is provided with the post 130 to serve to support the central portion 113 of the membrane 110. Meanwhile, the mass body 120 may be vibrated by disposing a driving unit or a displacement of the mass body 120 may be measured by disposing a sensing unit, due to elastic deformation between the central portion 113 and the edge 115 of the membrane 110. However, the driving unit and the sensing unit are not necessarily disposed between the central portion 113 and the edge 115 of the membrane 110. Therefore, one of the driving unit and the sensing unit may be disposed at the central portion 113 or the edge 115 of the membrane 110. In this case, the driving unit or the sensing unit may be implemented using a piezoelectric type, a piezoresistive type, a capacitive type, or the like, that are known to those skilled in the art.

The mass body 120 is displaced by an inertial force or a Coriolis force and is disposed below the central portion 113 of the membrane 110. In this case, the mass body 120 may be formed in, for example, a cylindrical shape. In addition, the post 130 is formed in a hollow shape to support the membrane 110, thereby securing a space in which the mass body 120 may be displaced. In this case, the post 130 is disposed under the edge 115 of the membrane 110. In this case, the post 130 may be generally formed in a square column shape. However, the shape of the mass body 120 and the post 130 is not limited thereto and thus, the mass body 120 and the post 130 may be formed in all the shapes that are known to those skilled in the art.

The stopper 140 limits the downward displacement of the mass body 120 and serves to prevent the membrane 110 from being damaged even though the excessive force is applied to the mass body 120. In this case, the stopper 140 is disposed inwardly more than the post 130 so as to form the space 143 between the stopper 140 and the post 130 in the bottom of the membrane 110. As described above, when the space 143 is formed between the stopper 140 and the post 130, the influence of disturbance or the noise occurring from the external environments through the predetermined region 145 of the membrane 110 disposed above the space 143 may be interrupted. In addition, as shown in FIG. 3, when at least two inertial sensors 100 share the central post 130, at least two inertial sensor 100 may occur the interference. However, when the space 143 is formed between the stopper 140 and the post 130 by including the stopper 140, it is possible to prevent at least two inertial sensors 100 from interfering with each other through the predetermined region 145 of the membrane 110 disposed above the space 143. As described above, it is possible to prevent the sensitivity of the inertial sensor 100 from being reduced by preventing the influence of disturbance or noise occurring from the external environment or the interference from the surrounding sensors.

Figure 4A:
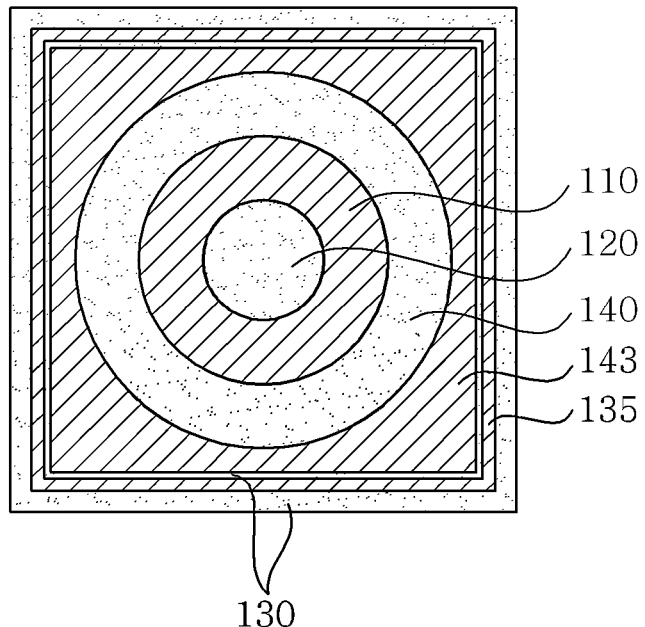
FIGS. 4A to 4D are bottom views showing a modified example of the inertial sensor shown in FIG. 2.
Figure 4B:
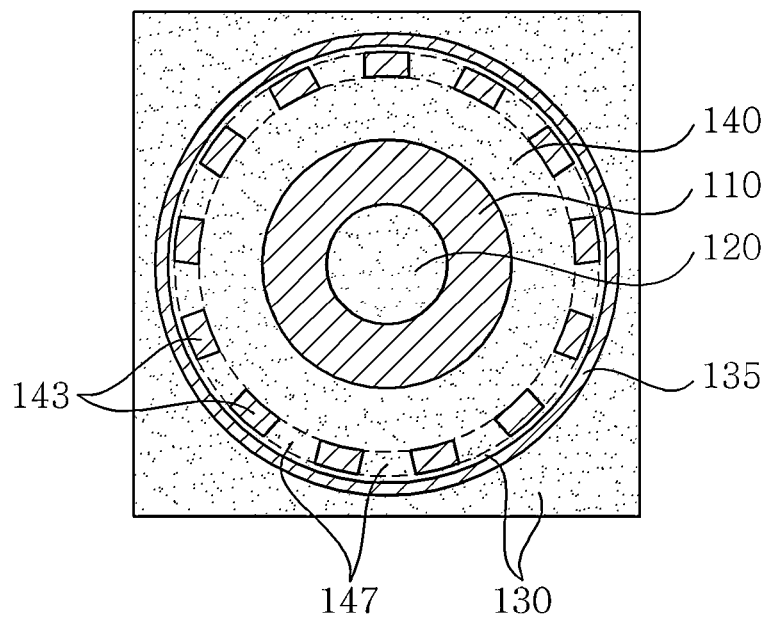

Meanwhile, the space 143 between the stopper 140 and the post 130 may be formed in an annular shape when being viewed from a cross section. That is, the outer peripheral surface of the stopper 140 and the inner peripheral surface of the post 130 are formed in a circular shape when being viewed from a cross section (see FIG. 2). However, the space 143 between the stopper 140 and the post 130 may be variously modified. First, as shown in FIG. 4A, the space 143 between the post 130 and the stopper 140 has an inner peripheral surface formed in a circular shape and an outer peripheral surface formed in a squared shape when being viewed from a cross section. Alternatively, as shown in FIG. 4B, extension parts 147 extending from the stopper 140 to the post 130 through the space 143 between the post 130 and the stopper 140 may be provided. In this case, the extension parts 147 may be formed in a predetermined pattern so as to be spaced from each other along the space 143 between the post 130 and the stopper 140. As described above, when the extension part 147 is formed below the membrane 110 in a predetermined pattern, an area of the predetermined region 145 (a region disposed above the space 143) of the membrane 110 is reduced, thereby variously controlling the rigidity of the membrane 110.

Figure 4C:
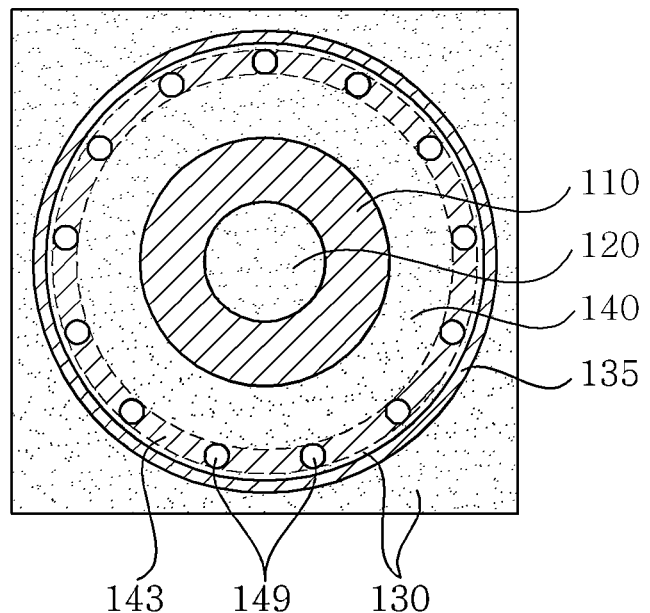

Meanwhile, as shown in FIG. 4C, the predetermined region 145 disposed above the space between the post 130 and the stopper 140 in the membrane 110 may be formed with a through hole 149. In this case, the through hole 149 is formed in a thickness direction of the membrane 110 and may be formed in plural along the predetermined region 145. As described above, the through hole 149 is formed in the membrane 110, thereby variously controlling the rigidity of the membrane 110.

Figure 4D:
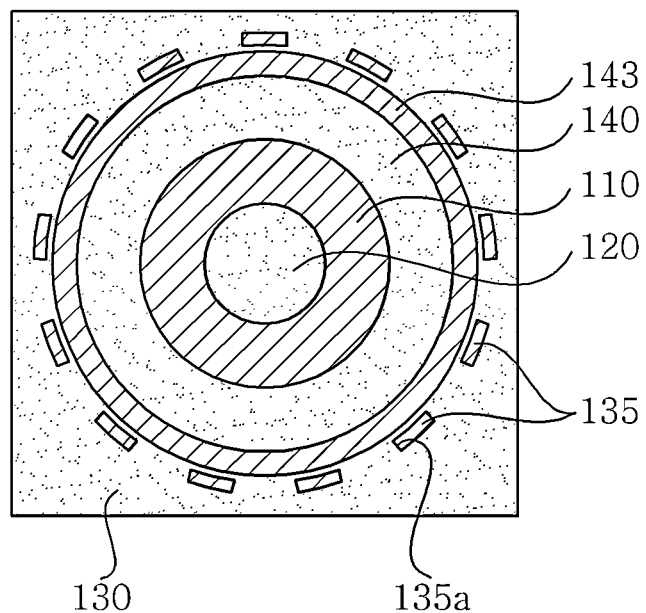

The cap 150 (see FIG. 1A) is provided below the post so as to cover the bottom of the post 130 to serve to protect the bottom portion of the inertial sensor 100 and the top surface of the cap 150 is bonded to the bottom surface of the post 130 by an adhesive 160. In this case, the adhesive 160 generally uses epoxies having low viscosity, such that a portion of the adhesive 160 may be permeated into the post 130 in the inertial sensor according to the prior art when the post 130 and the cap 150 are pressed so as to be bonded to each other. However, in the inertial sensor 100 according to the preferred embodiment of the present invention, the cavity 135 is disposed below the post 130, such that the adhesive 160 is introduced into the cavity 135 due to a surface tension, thereby preventing the adhesive 160 from being permeated into the post 130. Therefore, the degradation in the dynamic characteristics of the inertial sensor 100 may be prevented due to the permeation of the adhesive 160. In addition, the cavity 135 may be formed in an annular shape along the post 130 (see FIG. 2). However, the preferred embodiment of the present invention is not limited thereto and as shown in FIG. 4d, the cavity may be formed in a predetermined pattern spaced apart from each other along the post 130. As described above, when a plurality of the cavities 135 are formed in a predetermined pattern so as to be spaced apart from each other, the cavities 135 are formed with sides 135a and a contact area between the adhesive 160 and the cavity 135 may be increased, thereby reinforcing the adhesion between the post 130 and the cap 150.

Meanwhile, in order to simplify the manufacturing process, the above-mentioned mass body 120, post 130, and stopper 140 may be simultaneously formed by selectively etching the silicon substrate, or the like. In this case, the bottom surface of the post 130 and the bottom surface of the stopper 140 have the same height (see FIG. 1A). Therefore, the top surface of the cap 150 and the bottom surface of the post 130 are adhered to each other by the adhesive 160 of a predetermined thickness T and an interval G1 between the top surface of the cap 150 and when the bottom surface of the post 130 is spaced from the predetermined thickness T, an interval G2 between the top surface of the cap 150 and the bottom surface of the stopper 140 is also spaced apart from the predetermined thickness T. That is, the interval G2 between the top surface of the cap 150 and the bottom surface of the stopper 140 may be controlled by controlling the predetermined thickness T of the adhesive 160. As a result, as shown in FIG. 1B, when the membrane 110 is displaced downwardly, the stopper 140 moves downwardly by the predetermined thickness T, such that the stopper 140 stops by the contact of the bottom surface of the stopper 140 and the top surface of the cap 150, thereby limiting the downward displacement of the mass body 120. In addition, it is possible to control the interval G2 between the top surface of the cap 150 and the bottom surface of the stopper 140 by controlling the thickness of the cap 150 or the stopper 140 by machining the top surface of the cap 150 or the bottom surface of the stopper 140 if necessary, such that the downward displacement of the mass body 120 may be more precisely limited. As described above, the downward displacement of the mass body 120 is limited by adopting the stopper 140, such that it is possible to prevent the membrane 110 from being damaged even though the excessive force is applied to the mass body 120.

In addition, the central portion of the cap 150 may be preferably performed with a concave portion 155 depressed in a thickness direction. The central portion of the cap 150 is provided with the concave portion 155 to reduce the damping force of air applied to the mass body 120, thereby improving the dynamic characteristics. However, when the concave portion 155 is formed at the outer peripheral surface of the stopper 140, the bottom surface of the stopper 140 does not contact the top surface of the cap 150, such that the stopper 140 does not limit the downward displacement of the mass body 120, such that the concave portion 155 may be preferably formed in the outer peripheral surface of at least stopper 140.

Figure 5A:
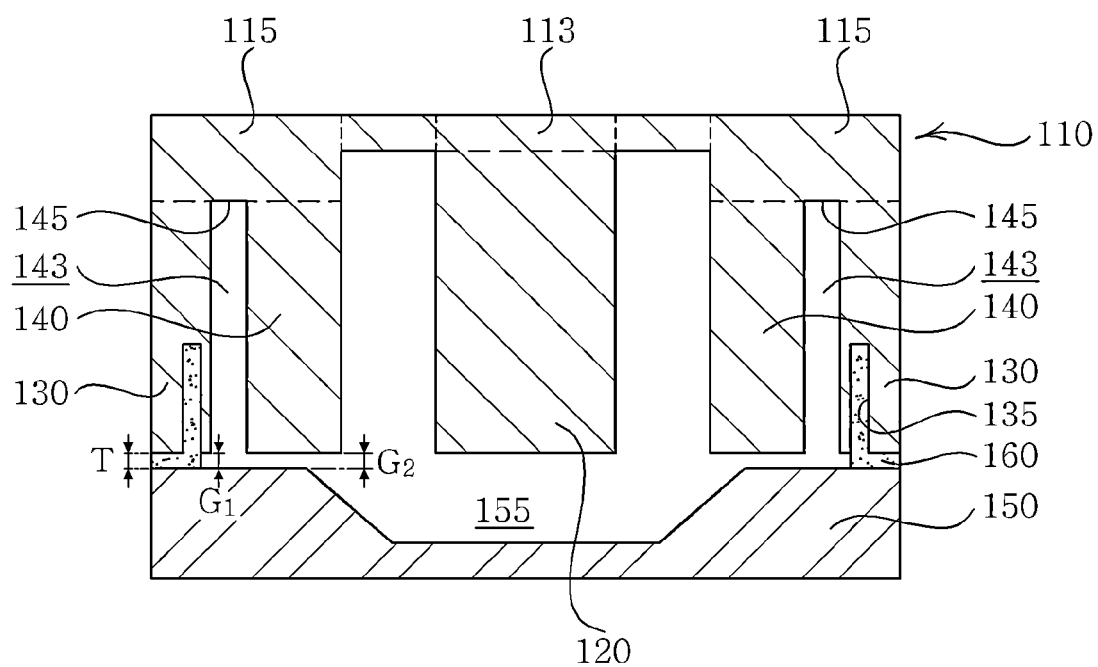
FIG. 5A is a cross-sectional view of a pressure sensor according to a preferred embodiment of the present invention.
Figure 5B:
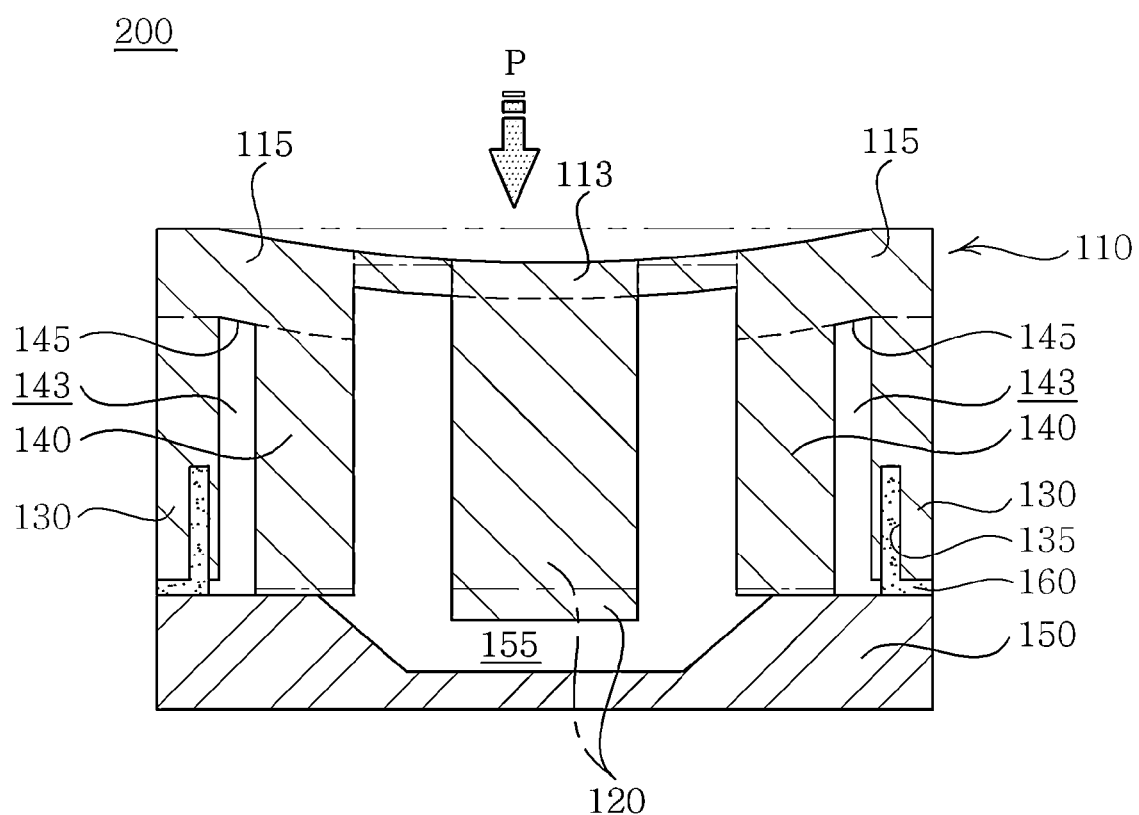
FIG. 5B is a cross-sectional view showing an operation process of the pressure sensor shown in FIG. 5A.

FIG. 5A is a cross-sectional view of a pressure sensor according to a preferred embodiment of the present invention and FIG. 5B is a cross-sectional view showing an operation process of the pressure sensor shown in FIG. 5A.

As shown in FIGS. 5A and 5B, the pressure sensor 200 according to the preferred embodiment of the present invention has a structure very similar to the above-mentioned inertial sensor 100. However, the pressure sensor 200 according to the preferred embodiment of the present invention has a difference in measuring the pressure without sensing the acceleration or the angular velocity as in the inertial sensor 100 and the difference is mainly described and therefore, the repeated contents thereof will be omitted.

The pressure sensor 200 serves to measure the change in the external pressure and the membrane 110 is vertically displaced according to the change in the external pressure. That is, as shown in FIG. 5A, when the external pressure is not applied, the membrane 110 maintains a flat state and as shown in FIG. 5B, when the predetermined pressure P is applied from the outside, the membrane 110 is bent to the cap 150 direction. Consequently, the sensing unit senses the bent degree of the membrane 110 to measure the change in the external pressure. In this case, the sensing unit may be implemented using a piezoelectric type, a piezoresistive type, a capacitive type, or the like. However, the pressure sensor 200 needs to be certainly sealed from the outside so as to measure the change in the external pressure. Therefore, the post 130 and the cap 150 may be bonded to each other by using adhesive 160 or by using anodic bonding, or the like, instead of the adhesive 160. Meanwhile, the pressure sensor 200 needs not to vibrate the mass body 120 as in the inertial sensor 100 and therefore, the driving unit vibrating the mass body 120 may be omitted.

Figure 6A:
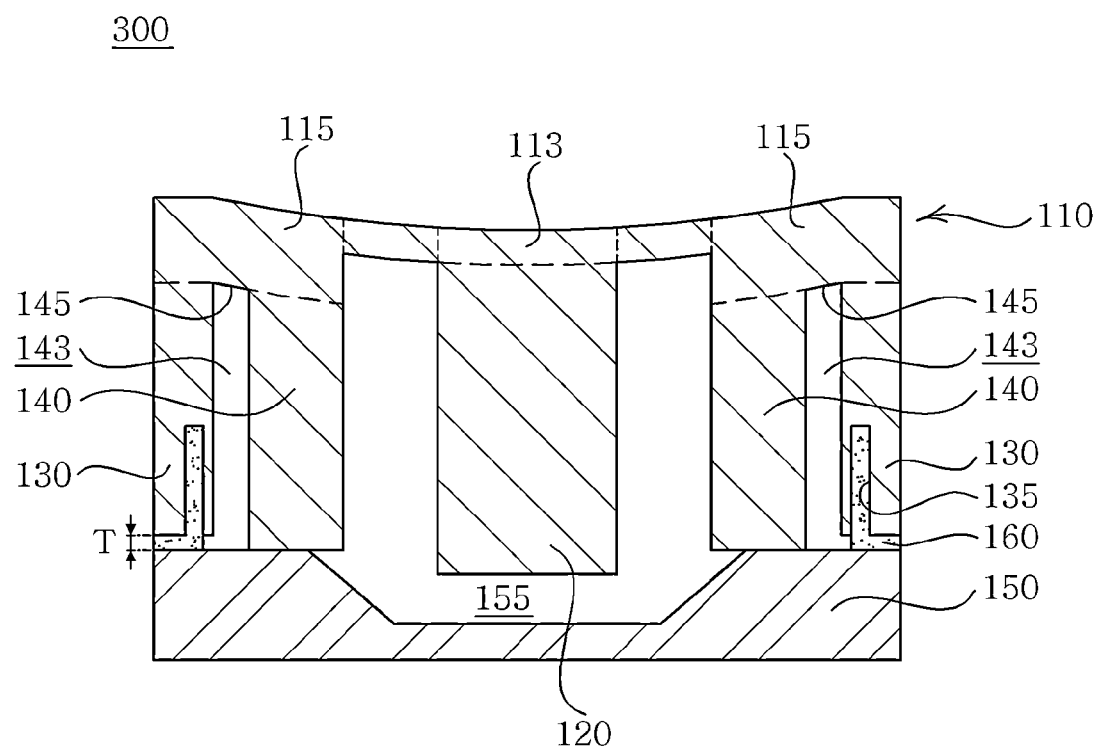
FIG. 6A is a cross-sectional view of an oscillator according to the preferred embodiment of the present invention.
Figure 6B:
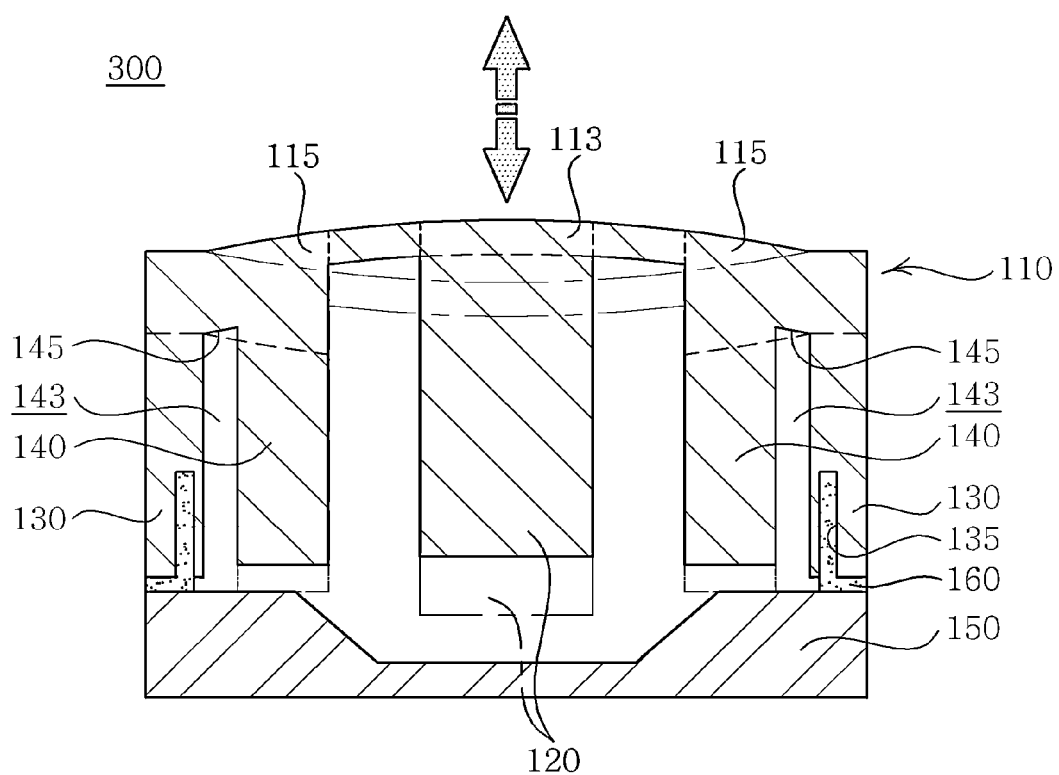
FIG. 6B is a cross-sectional view showing an operation process of the oscillator shown in FIG. 6A.

FIG. 6A is a cross-sectional view of an oscillator according to the preferred embodiment of the present invention and FIG. 6B is a cross-sectional view showing an operation process of the oscillator shown in FIG. 6A.

As shown in FIGS. 6A and 6B, the oscillator 300 according to the preferred embodiment of the present invention has a structure very similar to the above-mentioned inertial sensor 100. However, the oscillator 300 according to the preferred embodiment of the present invention has a difference in providing vibration without sensing the acceleration or the angular velocity as in the inertial sensor 100 and the difference is mainly described and therefore, the repeated contents thereof will be omitted.

The oscillator 300 serves to provide vibration at a predetermined amplitude to generate vibration to the mass body 120 disposed below the membrane 110 through the driving force of the driving unit. That is, as shown in FIG. 6A, the membrane 110 maintains the flat state when the operation is not performed and a shown in FIG. 6B, when the driving force is applied from the driving unit, a vibrator of the membrane 110 is vertically vibrated and the vibration may be provided to the outside. In this case, the driving unit may be implemented using a piezoelectric type or a capacitive type, or the like. Meanwhile, the oscillator 300 may omit the sensing unit measuring the displacement of the mass body 120 without sensing the acceleration or the angular velocity as in the inertial sensor 100

As described above, the MEMS component according to the exemplary embodiment of the present invention is described based on the inertial sensor 100, the pressure sensor 200, and the oscillator 300. However, the MEMS component according to the exemplary embodiment of the present invention is not necessarily limited to the inertial sensor 100, the pressure sensor 200, and the oscillator 300 and may be applied to all types of MEMS components having the same structure.

As set forth above, the preferred embodiments of the present invention can prevent an influence of disturbance occurring from external environments or noise or the interference from the surrounding sensors and thus, prevent the sensitivity of the MEMS component from reducing, by forming the space between the post and the stopper to use the predetermined region of the membrane disposed above the space.

In addition, the preferred embodiments of the present invention can prevent the membrane from being damaged even though the excessive force is applied to the mass body, by limiting the downward displacement of the mass body by adopting the stopper.

In addition, the preferred embodiments of the present invention can prevent the adhesive from permeating into the post and thus, deteriorate the dynamic characteristics of the MEMS component, by disposing the cavity on the bottom surface of the post to introduce the adhesive into the cavity when the post is bonded to the cap by the adhesive.

Although the preferred embodiments of the present invention have been disclosed for illustrative purposes, they are for specifically explaining the present invention and thus a micro electro mechanical systems component according to the present invention is not limited thereto, but those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A MEMS component, comprising:
a plate-shaped membrane;
a post disposed under an edge of the membrane;
a stopper disposed under the membrane and disposed more inwardly than the post so as to form a space between the stopper and the post; and
a cap disposed under the post so as to cover the post.

2. The MEMS component as set forth in claim 1, wherein a top surface of the cap and a bottom surface of the post are bonded to each other by an adhesive, and
the bottom surface is provided with at least one cavity into which an adhesive is introduced.

3. The MEMS component as set forth in claim 1, wherein the top surface of the cap and the bottom surface of the post are bonded to each other by the adhesive having a predetermined thickness and an interval between the top surface of the cap and the bottom surface of the stopper is spaced apart from each other by the predetermined thickness.

4. The MEMS component as set forth in claim 1, wherein the bottom surface of the stopper contacts the top surface of the cap when the membrane is displaced downwardly.

5. The MEMS component as set forth in claim 1, further comprising a mass body disposed below a central portion of the membrane.

6. The MEMS component as set forth in claim 1, wherein the central portion of the cap is provided with a concave portion depressed in a thickness direction.

7. The MEMS component as set forth in claim 1, wherein the space between the post and the stopper is formed in an annular shape when being viewed from a cross section.

8. The MEMS component as set forth in claim 1, wherein the space between the post and the stopper has an inner peripheral surface formed in a circular shape and has an outer peripheral surface formed in a squared shape when being viewed from a cross section.

9. The MEMS component as set forth in claim 1, further comprising extension parts extending from the stopper to the post through the space and formed in a predetermined pattern so as to be spaced apart from each other.

10. The MEMS component as set forth in claim 2, wherein a plurality of the cavities are formed in a predetermined pattern so as to be spaced from each other along the post.

11. The MEMS component as set forth in claim 1, wherein the predetermined region disposed above the space between the post and the stopper in the membrane is provided with a through hole in a thickness direction of the membrane.

12. The MEMS component as set forth in claim 1, wherein the MEMS component is an inertial sensor.

13. The MEMS component as set forth in claim 1, wherein the MEMS component is a pressure sensor.

14. The MEMS component as set forth in claim 1, wherein the MEMS component is an oscillator.

* * * * *